US009261549B2

(12) United States Patent
Phillips et al.

(10) Patent No.: US 9,261,549 B2
(45) Date of Patent: Feb. 16, 2016

(54) LEAKAGE CURRENT SENSOR FOR SUSPENSION TYPE INSULATOR

(71) Applicant: Electric Power Research Institute, Inc., Charlotte, NC (US)

(72) Inventors: Andrew John Phillips, Harrisburg, NC (US); Chris Engelbecht, Ede (NL); J. Mark Major, San Antonio, TX (US); Bob Lynch, Fuquay-Varina, NC (US)

(73) Assignee: ELECTRIC POWER RESEARCH INSTITUTE, INC., Charlotte, NC (US)

( * ) Notice: Subject to any disclaimer, the term of this patent is extended or adjusted under 35 U.S.C. 154(b) by 332 days.

(21) Appl. No.: 13/728,462

(22) Filed: Dec. 27, 2012

(65) Prior Publication Data

US 2013/0169285 A1 Jul. 4, 2013

Related U.S. Application Data

(60) Provisional application No. 61/580,808, filed on Dec. 28, 2011.

(51) Int. Cl.
 *G01R 31/02* (2006.01)
 *G01R 15/18* (2006.01)
(52) U.S. Cl.
 CPC .............. *G01R 31/02* (2013.01); *G01R 15/186* (2013.01)
(58) Field of Classification Search
 CPC ............................. G01R 31/02; G01R 15/186
 USPC ........................................................ 324/509
 See application file for complete search history.

(56) References Cited

U.S. PATENT DOCUMENTS

| 4,224,612 | A | * | 9/1980 | Macey ........................ 340/647 |
| 4,728,887 | A | | 3/1988 | Davis |
| 4,758,792 | A | * | 7/1988 | Polonis et al. ............... 324/552 |
| 5,610,512 | A | | 3/1997 | Selcuk |
| 6,091,237 | A | * | 7/2000 | Chen ............................ 324/142 |
| 6,205,867 | B1 | | 3/2001 | Hayes et al. |
| 6,523,424 | B1 | | 2/2003 | Hayes et al. |
| 6,633,169 | B1 | * | 10/2003 | Cavigelli ..................... 324/551 |

(Continued)

FOREIGN PATENT DOCUMENTS

| EP | 2006699 | 12/2008 |
| JP | 0062278465 | 12/1987 |

(Continued)

OTHER PUBLICATIONS

A. Semenova, WIPO International Search Report for PCT/US2012/051699, Nov. 9, 2012, Russia.

(Continued)

*Primary Examiner* — Jeff Natalini
(74) *Attorney, Agent, or Firm* — Trego, Hines & Ladenheim, PLLC; Brandon Trego (57) ABSTRACT

A sensor apparatus for detecting leakage current in a suspension-type insulator of an electrical power system is disclosed. The sensor apparatus includes a housing having a leakage current sensor contained therein, a door pivotally connected to the housing and adapted to move between an open position where a grounded end fitting of the insulator is received by the sensor apparatus and a closed position, and a clamping mechanism connected to the housing. The leakage current sensor is adapted to detect a leakage current along the insulator. The clamping mechanism is adapted to clamp the sensor apparatus to the grounded end fitting of the insulator.

21 Claims, 6 Drawing Sheets

(56) References Cited

U.S. PATENT DOCUMENTS

| | | |
|---|---|---|
| 6,788,426 B1 | 9/2004 | Yamanaka et al. |
| 7,002,331 B2 | 2/2006 | Sae-Ueng et al. |
| 7,067,829 B2 | 6/2006 | Richards et al. |
| 7,369,045 B2 | 5/2008 | Hansen |
| 7,421,258 B2 | 9/2008 | Bauschke et al. |
| 7,486,084 B2 | 2/2009 | Phillips et al. |
| 7,494,271 B2 | 2/2009 | Scholtz et al. |
| 7,615,132 B2 | 11/2009 | Yasui et al. |
| 7,620,517 B2 | 11/2009 | Scholtz et al. |
| 7,641,387 B2 | 1/2010 | Engelhardt et al. |
| 7,748,269 B2 | 7/2010 | Wu et al. |
| 7,808,250 B2 | 10/2010 | Honda et al. |
| 2005/0050820 A1* | 3/2005 | Bowman .............. 52/302.1 |
| 2006/0284647 A1* | 12/2006 | Gunn et al. ............ 324/771 |
| 2007/0013199 A1* | 1/2007 | Hall et al. ............. 294/106 |
| 2009/0243876 A1 | 10/2009 | Lilien et al. |
| 2010/0100239 A1 | 4/2010 | Park et al. |
| 2011/0101989 A1 | 5/2011 | Hyde et al. |
| 2012/0092115 A1 | 4/2012 | Srinivasrao et al. |

FOREIGN PATENT DOCUMENTS

| | | |
|---|---|---|
| JP | 2000131258 | 9/2004 |
| RU | 2212678 | 9/2003 |
| RU | 2233754 | 8/2004 |
| RU | 89792 | 12/2009 |
| SU | 724338 | 3/1980 |
| SU | 1305031 | 4/1987 |
| SU | 1642530 | 4/1991 |

OTHER PUBLICATIONS

Y. Usikova, WIPO International Search Report for PCT/US2012/051695, Nov. 21, 2012, Russia.

O. Schedrina, WIPO International Search Report for PCT/US2012/072012, Mar. 13, 2013, Russia.

O. Schedrina, WIPO International Search Report for PCT/US2012/072023, Mar. 21, 2013, Russia.

Sorqvist, Outdoor polymeric insulators long-term exposed to HVDC, IEEE Trans. on Power Delivery, V. 12, No. 2, Apr. 1997, p. 1041-1048.

Vishay, Resistors—Linear—Current Sensing, p. 1-4, 2014.

Kurihara, Construction of remote monitoring system for separate measurement of leakage current of outdoor insulators, p. 401-404, Jun. 1-5, 2003, Proc. of 7th Inter. Conf. on Properties and Apps. of Dielectric Materials, Nagaya, Japan.

Pylarinos, Impact of noise related waveforms on long term field leakage current measurements, IEEE Trans on Dielectrics and Electrical Insulation, V.18, No. 1, Feb. 2011, p. 122-129.

* cited by examiner

LEAKAGE CURRENT SENSOR FOR SUSPENSION TYPE INSULATOR

BACKGROUND OF THE INVENTION

The present invention relates generally to the monitoring of leakage currents in a transmission system and, more particularly, to a sensor for accurately detecting and monitoring leakage current in suspension type insulators.

In many countries, including the US, wood is utilized as part of the line insulation to improve the basic insulation level (BIL) of the line, as it has been recognized that the lighting performance of transmission lines can be improved by utilizing the wood support or pole. This has, however, not been without problems as there were, and still are, many instances of fires of the wood poles and cross arms caused by low frequency leakage current and sparking on the wood from sources such as leakage current due to insulator contamination despite mitigation measures being taken.

Insulators installed on transmission and distribution systems are exposed to contamination, for example from marine salt, road salt, and industrial pollutants. This contamination can result in flashover of the insulator, usually under light wetting conditions, e.g. condensation, when the salts and water mix to become a conductive electrolyte. Flashover is a problem in that it results in an outage which interrupts power to a utility company's customers.

When the salts on the surfaces of an insulator become wet they form an electrolyte which is conductive. Since the one end of the insulator is energized, and the other end is grounded, currents flow along the insulator surfaces. If these currents are large enough, arcing will occur (called dry band arcing). This arcing will either extinguish or grow to result in a flashover. The magnitude of leakage currents that occur under dry band arcing conditions provide an indication of the risk of the insulator flashing over. If insulators are at risk of flashover due to contamination build-up, utilities can wash the insulators or take other measures, such as redirect power to other transmission and distribution assets.

In addition when composite (also called polymer or non-ceramic) or coated insulators are used the leakage currents and arcing on the surface can degrade the rubber material. By monitoring the leakage currents an indication can be obtained as to the level of degradation.

Some commonly used mitigation measures are listed below; however, none of these mitigation measures provide a means for monitoring and pinpointing potential leakage current problems so that a utility company can take preventative measures.

1. Wrapping metal bands around the wood pole and connecting it to the insulator hardware. This method has the advantage that the reduction in the "insulated" wood path lengths (used as improvement for the BIL) is limited. The conductor material used for this purpose should be compatible with other hardware not to cause corrosion.

2. A small guard electrode, in the form of a coach screw or a multi-spiked plate (e.g. gang-nail), is fastened to the wood outside the rain shadow area and bonded to the insulator hardware. This method has a minimal effect on the BIL of the structure.

3. Application of conducting paint to cover the high resistance zones around metal to wood interfaces. This method has a minimal effect on the BIL of the structure.

4. Bonding of the insulator hardware together with a conductor. The intension with this bond wire is to "balance" the leakage current so that only a small residual current will flow in the pole. There are two variants to this scheme:

(a) The insulator bases are connected together but not grounded. The ground lead terminates some distance away to realize the required BIL phase-to-ground for induced lightning surges.
   (b) The insulator bases can be bonded together and connected to ground. In this case the wood is not utilized anymore as part of the line insulation against lightning. Also here it is important that the material of the bond wire is selected to be compatible with the other hardware used to prevent corrosion.

5. An extension of the previous method is to use steel cross-arms to bond the insulator bases together. The steel cross-arm can either be grounded or be left floating depending on whether or not the utility wants wood as part of the line insulation for lightning performance.

6. Finally the insulators used can be upgraded to those with an improved contamination performance. For example porcelain insulators can be replaced by hydrophobic silicone rubber composite insulators. Other options include regular insulator cleaning or the application of silicone grease to insulators.

BRIEF SUMMARY OF THE INVENTION

These and other shortcomings of the prior art are addressed by the present invention, which provides a leakage current monitoring system that continuously monitors and reports potential leakage current issues to allow an action to be taken to mitigate any potential problems that may arise from the leakage current.

According to one aspect of the invention, a sensor apparatus for detecting leakage current in a suspension-type insulator of an electrical power system includes a housing having a leakage current sensor contained therein, a door pivotally connected to the housing and adapted to move between an open position where a grounded end fitting of the insulator is received by the sensor apparatus and a closed position, and a clamping mechanism connected to the housing. The leakage current sensor is adapted to detect a leakage current along the insulator. The clamping mechanism is adapted to clamp the sensor apparatus to the grounded end fitting of the insulator.

According to another aspect of the invention, a sensor apparatus for detecting leakage current in a suspension-type insulator of an electrical power system includes a housing having a first half of a leakage current sensor contained therein, a door pivotally connected to the housing and having a second half of a leakage current sensor contained therein, and a clamping mechanism connected to the housing. The leakage current sensor is adapted to detect a leakage current along the insulator. The door is adapted to move between an open position where a grounded end fitting of the insulator is received by the housing and a closed position, wherein when the door is moved to the closed position, mating surfaces of the first and second halves of the leakage current sensor join together to create a closed perimeter around the grounded end fitting. The clamping mechanism is adapted to clamp the sensor apparatus to the grounded end fitting of the insulator.

According to another aspect of the invention, a method of detecting leakage current in a suspension-type insulator of an electrical power system includes the steps of providing a sensor apparatus having a leakage current sensor, an electronics module, and a communications system. The method further includes the steps of conducting a leakage current from a grounded end fitting of the insulator through a current transformer of the leakage current sensor, generating an analog signal proportional to the leakage current flowing through the current transformer using the electronics module to receive the analog signal and convert the analog signal to a digital value, and using the communications system to wirelessly transmit the digital value to an external receiver.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
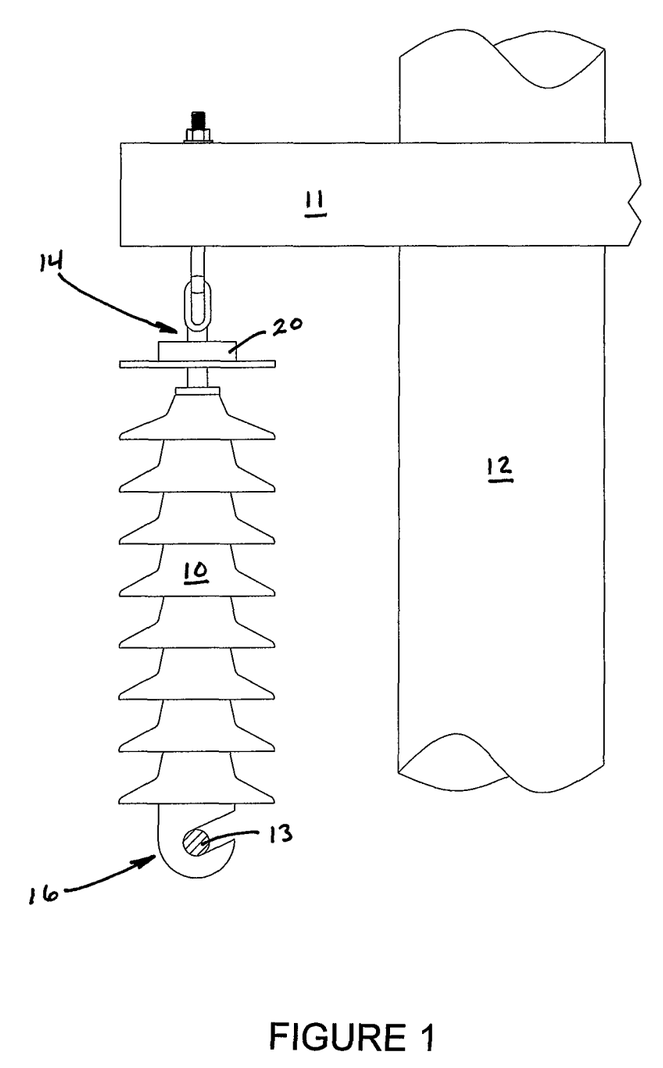
FIG. 1 is a schematic side view of a portion of a utility pole carrying a suspension-type insulator and a sensor unit constructed according to an aspect of the present invention.

Referring now to the drawings, wherein identical numerals indicate the same elements throughout the figures, FIG. 1 schematically depicts an insulator 10 which is suspended from a cross-arm 11 of a utility pole 12 and which supports an electrical conductor 13. The insulator 10 is a known suspension-type insulator having a generally cylindrical exterior shape with an upper end or grounded end fitting 14 and a lower end 16 connected to the electrical conductor 13, and is made from an electrically insulating (i.e., non-electrically-conductive) material. An exemplary sensor unit for accurately detecting and monitoring leakage currents according to an embodiment of the invention is mounted on the upper end 14 and shown generally at reference numeral 20.

In summary, the sensor unit 20 is an RF sensor which attaches to the insulator's grounded end 14, measures the leakage current flowing in the insulator 10, processes the current and assigns them to specific ranges. The sensor unit 20 then transmits the information wirelessly to either a local base station or a handheld device.

Figure 2:
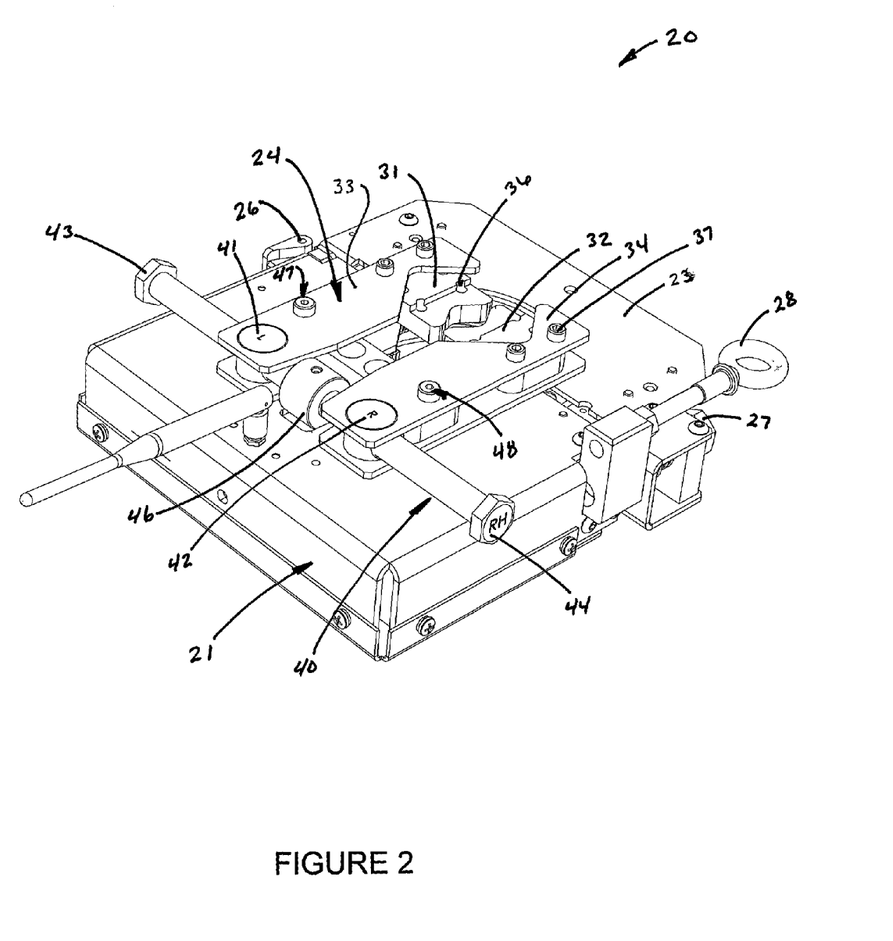
FIG. 2 is a perspective view of the sensor unit shown in FIG. 1.
Figure 3:
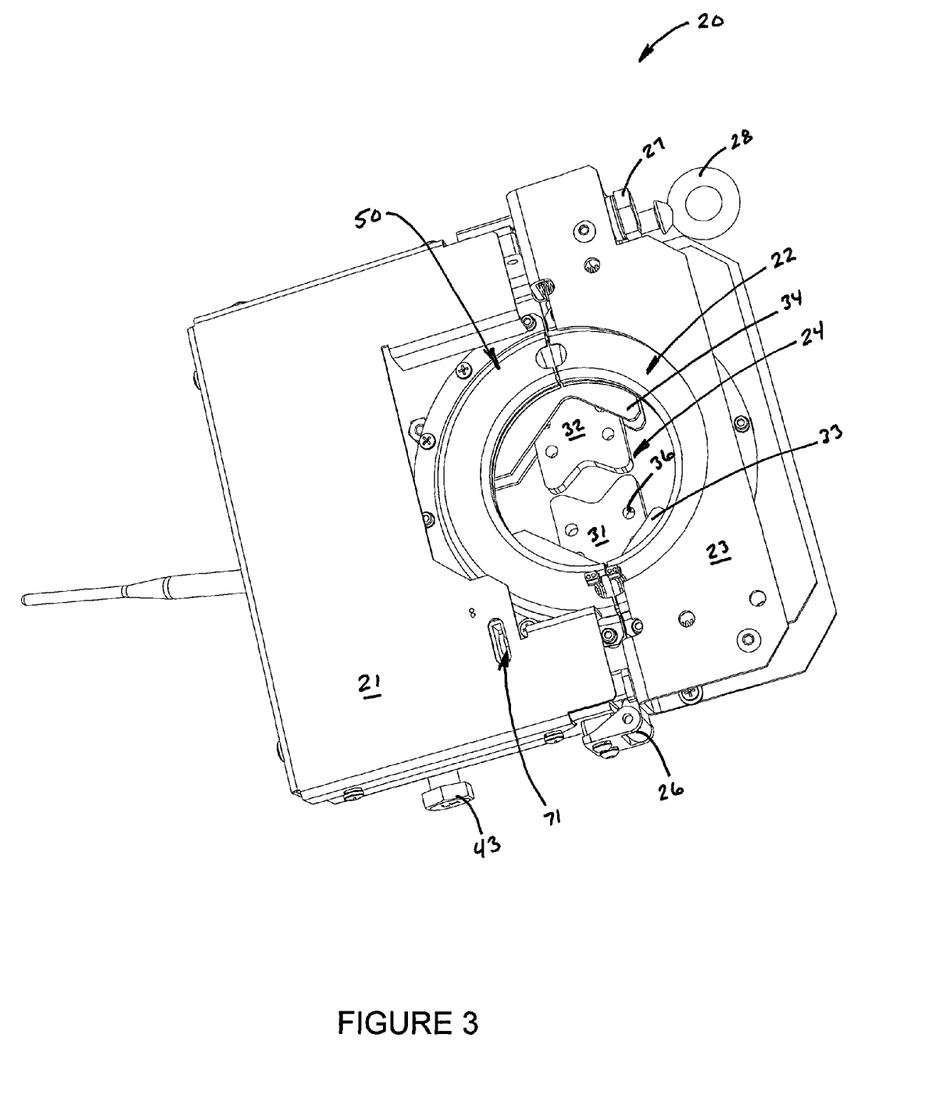
FIG. 3 is another view of the sensor unit shown in FIG. 1.

Referring to FIGS. 2 and 3, the sensor unit 20 includes a housing 21 for containing a leakage current sensor 22 and electronic module 70 (shown in FIG. 4), a door 23 hinged to the housing 21 to allow the sensor unit 20 to be positioned onto the insulator 10, and a clamping mechanism 24 for clamping the sensor unit 20 to the insulator 10. The housing 21 is a metal housing which encloses the sensor unit's functional components (described in detail below) and protects them from electromagnetic influences.

The door 23 is pivotally hinged to the housing 21 at hinge 26 to allow the door 23 to pivot away from the housing 21 to an open position and allow the sensor unit 20 to be installed on the insulator 10. Fastener 27 secures the door 23 to the housing 21 in a closed position once the sensor unit 20 has been installed. A hot stick adapter 28 is connected to the housing 21 and positioned next to fastener 27 to allow a user to use a hot stick for placement of the sensor unit 20 on the insulator 10. The hinge 26 is resistive in nature so that it moves freely, making it easier for the installer—especially under live line conditions.

Clamping mechanism 30 is secured to the housing 21 and includes first and second adjustable clamping jaws 31 and 32 connected to first and second pivotable arms 33 and 34, respectively. The jaws 31 and 32 are used to mechanically attach the sensor unit 20 to the grounded end 14 of the insulator 10 and are adjustable to account for different insulator end fitting diameters. As shown in FIG. 2, the jaws 31 and 32 include apertures 36 for receiving fasteners therethrough and to allow for adjustment of the jaws 31 and 32 with respect to arms 33 and 34. The jaws 31 and 32 are adjusted by removing fasteners 37, moving the jaws 31 and 32 relative to arms 33 and 34 until a desired aperture 36 (representative of a specific diameter) aligns itself with apertures in the arms 33 and 34. The fasteners 37 are then re-installed through the apertures in the arms and apertures 36 to secure the jaws 31 and 32 in position. As illustrated, the jaws 31 and 32 have a V or U shaped profile for mating engagement with the grounded end 14 of the insulator 10.

The jaws 31 and 32 are moved between opened and closed positions by a bolt mechanism 40 connected to threaded collars 41 and 42 disposed at an end of the arms 33 and 34, respectively. The bolt mechanism 40 includes a pair of opposing bolts 43 and 44 coupled together at their ends by a coupling 46. Each of the bolts 43, 44 extend through a respective one of the threaded collars 41, 42. As the bolts 43 and 44 are turned, the threaded collars 41 and 42 move along the length of the bolts 43 and 44, which in turn causes the arms 33 and 34 to move about pivots 47 and 48 such that they move the jaws 31 and 32 between opened and closed positions. The key feature of the bolt mechanism 40 is that it allows a user to turn either one of the bolts 43, 44 to open and close the jaws 31 and 32, thereby eliminating any issues with the user being on a specific side of the sensor unit 20. When installing the sensor unit 20 onto the grounded end fitting 14, the door 23 and jaws 31, 32 are moved to the open position for receiving the end fitting 14. The jaws 31, 32 are then moved to the closed position to clamp onto the end fitting 14. With the sensor unit 20 firmly clamped to the end fitting 14, the door 23 is then moved to the closed position and secured in place by fastener 27.

Figure 4:
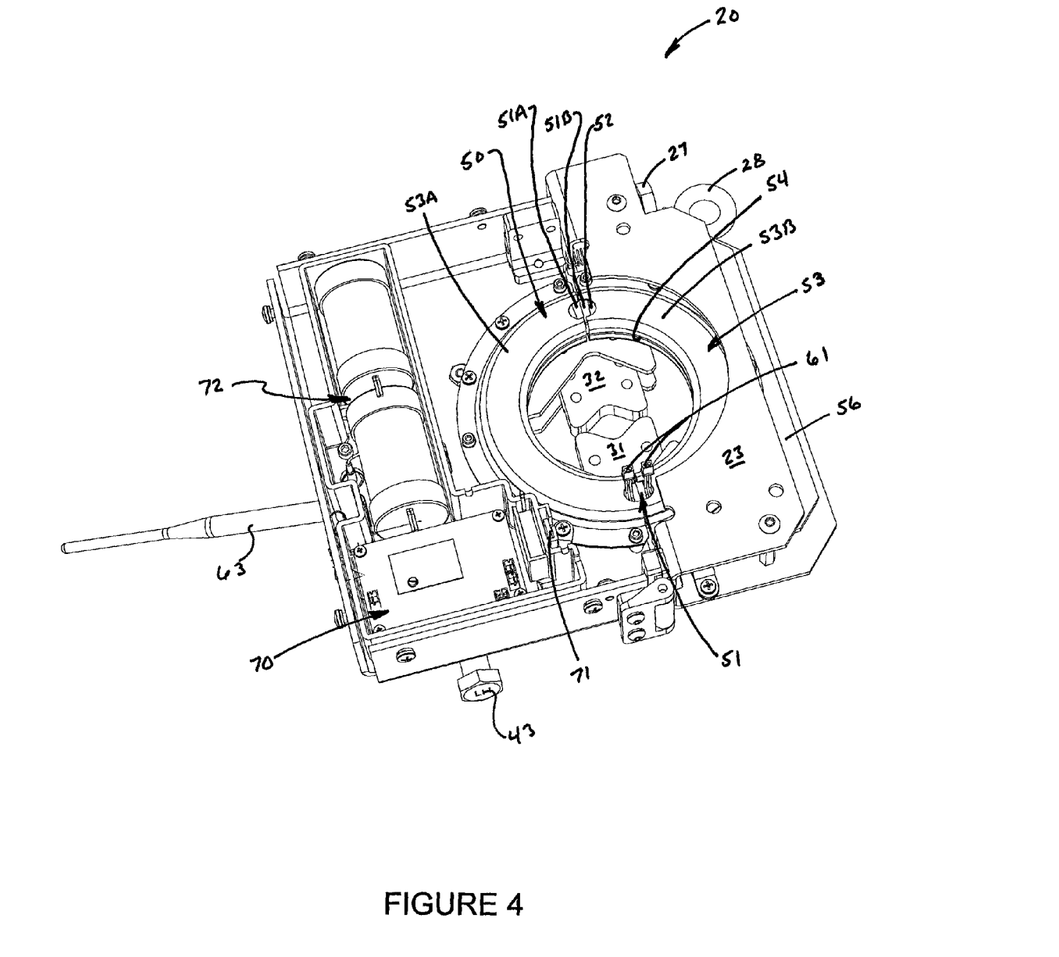
FIG. 4 is a view of the sensor unit of FIG. 1 with a cover removed to show the internal components.

Referring to FIG. 4, the leakage current sensor 22 includes a toroidal current transformer 50 with a frequency response from <5 Hz to >100 kHz and a sensitivity of lower than 10 mA. The transformer 50 is formed by a leakage current toroidal ferrite core 51 and winding 52 wound around the core 51 with multiple turns. The core 51 is formed of two halves 51A and 51B so that it can surround the grounded end 14 of insulator 10. When the two halves 51A and 51B of the core 51 are put together, the voltage output from the windings 52 is proportional to the current flowing through the middle of the core 51.

A sheet metal housing 53 (steel which is ferromagnetic for magnetic field shielding) surrounds the core 51. As shown, the housing 53 is also formed by two halves 53A and 53B to surround respective core halves 51A and 51B. The metal housing 53 is split along an inside with a metal slot 54, See FIG. 5, so that the core 51 can still couple with a magnetic field from current flowing in an insulator's metal end fitting. This enables the core 51 to be shielded from stray magnetic fields which are not due to current flowing through an insulator end fitting but still measure the currents flowing through the insulator metal end fitting. This is very important as there are large magnetic fields due to the currents flowing in the conductors which are energized at ends of the insulators.

Figure 5:
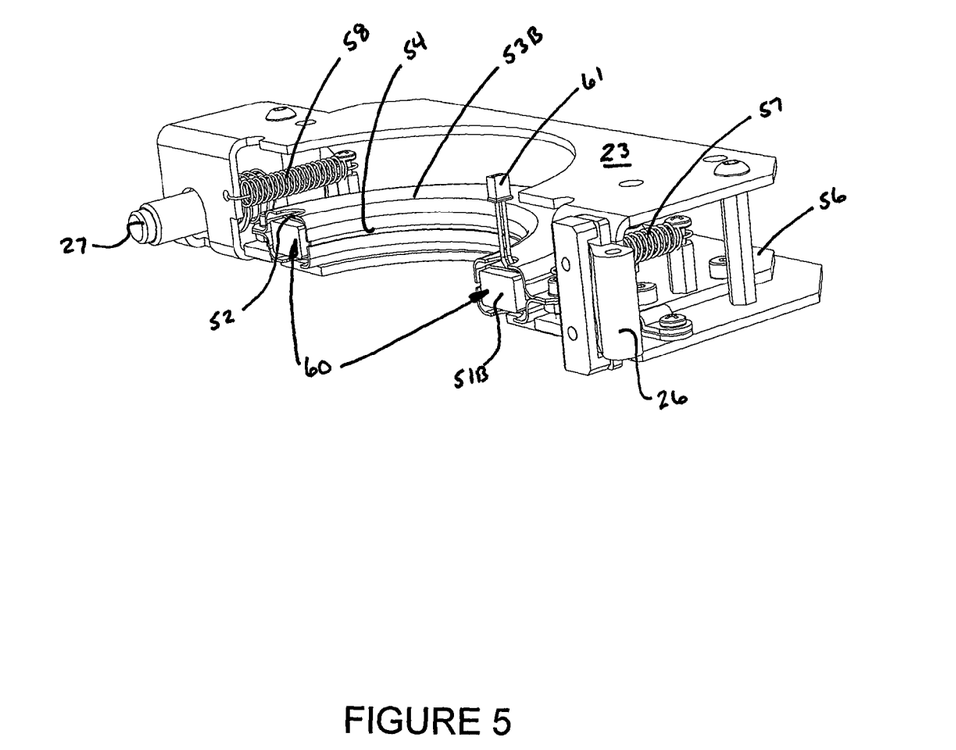
FIG. 5 shows a door of the sensor unit of FIG. 1.

As shown in FIG. 5, core 51B and housing 53B are installed in the door 23 so that the sensor unit 20 can be installed in the field on insulators without removing them from service. The core 51B and housing 53B are connected to a plate 56 which is connected to the door 23. The plate 56 is moveable relative to the door 23 and is biased towards the housing 21 by springs 57 and 58 to ensure that mating surfaces 59 and 60 of cores 51A and 51B are properly mated together. The mating surfaces 59 and 60 of the cores 51A and 51B are machined with key patterns so that alignment is ensured between the two cores. Alignment is vital so that the unit consistently measures the leakage currents flowing through the end fitting of the insulator, and it reduces the influence of stray magnetic fields.

Referring again to FIG. 4, an output 61 from the sensor 22 operably connects the sensor 22 to the electronics module 70. The electronics module 70 is imbedded in potting compound to protect it from both environmental and electromagnetic influences and includes analog, digital, and radio frequency (RF) electronics which function to receive, process, and store signals from the sensor 22, to receive external commands, and to transmit data to an external source. The electronics module 70 may include, for example, a printed circuit board incorporating analog, digital and/or radio-frequency ("RF") electronic components or may incorporate discrete components and/or one or more microprocessors.

In addition to the electronics module 70, the housing 21 includes an electric power source for the electronics module 70, such as the illustrated batteries 72. The housing 21 also includes one or more RF antennas 63 which protrude from the exterior of the housing 21 and are used to transmit signals generated by the electronics module 70 to a remote receiver (not shown), and/or to receive RF signals from a remote receiver (not shown). The sensor unit 20 incorporates a communication system that may be based on the IEEE 805.15.4 architecture. The communication protocol is customized to allow two-way communications.

In the illustrated example, one or more magnetically-operated switches 71 are mounted inside the housing 21 and coupled to the electronics module 70. The switches 71 may be tripped by placing a magnet in the near vicinity of the switch 71 on the outside of the housing 21. In the illustrated example, the sensor unit 20 may includes a power switch which toggles the sensor unit 20 between the on and off state, and a reset switch which signals the sensor unit 20 to erase any stored data.

The electronics module 70 may include a temperature sensor, in order to assist in assessing condensation conditions. The electronics module 70 may also include a 3D accelerometer, in order to assess whether the insulator or structure is experiencing vibration issues.

Figure 6:
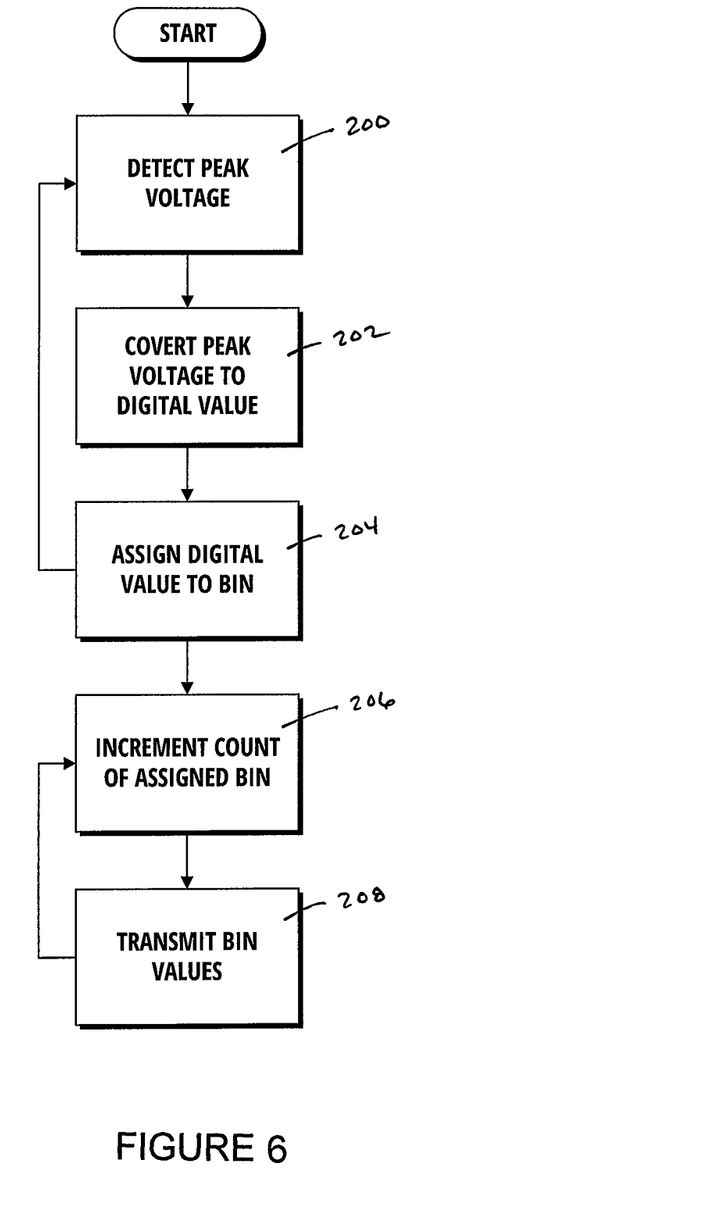
FIG. 6 is a block diagram showing the operation of the sensor unit of FIG. 1.

The operation of the electronics module 70 and the sensor unit 20 will now be described with reference to the block diagram in FIG. 6. In block 200, the electronics module 70 uses a peak detect circuit of a known type to measure and hold a voltage signal from the sensor assembly described above. The voltage signal is proportional to the highest leakage current measured in a predetermined first time interval, e.g. 60 seconds. This peak detect circuit is reset at the first interval, e.g. 60 seconds, based on a digital signal from the microprocessor. At block 202, an Analog to Digital (A/D) converter (which may be part of a microprocessor of the electronics module 70) measures the value from the peak detect circuit, repeating as the first interval. At block 204, the microprocessor evaluates the digital value and assigns the value to membership in a category or "bin". The bin represents a range in which the measured value lies. For example, there may be six numbered bins which account for different leakage current magnitudes. Examples of two different settings for the leakage current threshold for the bins are listed in Table 1 below, in which "regular" indicates a classification that is relatively less sensitive to leakage currents and "sensitive" indicates a classification that is relatively more sensitive to leakage currents.

TABLE 1

| BIN NUMBER | CURRENT RANGE, REGULAR (PEAK mA) | CURRENT RANGE, SENSITIVE (PEAK mA) |
|---|---|---|
| 1 | 0-10 | 0-1 |
| 2 | 10-20 | 1-2 |
| 3 | 20-50 | 2-5 |
| 4 | 50-200 | 5-20 |
| 5 | 200-500 | 20-50 |
| 6 | 500+ | 50+ |

The electronics module 70 maintains a counter for each of the bins. When the digital value is assigned to a bin, the counter for that bin is incremented (see block 206). At block 208, the number of counts in each bin is then transmitted using RF to a remote receiver. The transmission repeats at a second interval which is preferably shorter than the first interval described above.

The sensor unit 20 only stores the statistical parameters (i.e. the bin counts) of the leakage current peaks that occur. No other leakage current parameters need be recorded. Using the communications system described above, a remote user can reset the bins or change the ranges of the bins remotely.

The sensor unit 20 also keeps track of the time since the last reset. This limits the data message sent by the device to the bare minimum. It also limits the internal circuit complexity and power consumption for the device. Based on the battery characteristic and low power consumption of the sensor unit 20, battery life is estimated at more than 10 years.

The sensor units 20 can be employed in different modes. For example, when installed on transmission lines the sensor units 20 may be polled a only few times per year when line maintenance crews do inspections or maintenance, for example using handheld receivers (not shown).

Alternatively, in substations or on specific transmission line structures a more sophisticated approach may be followed. A dedicated base station system (not shown) installed at the substation/structure would poll the nearby sensor units 20 at a short time interval. This base station stores leakage current data together with weather parameters from attached sensors. The data is then transmitted from the base station using a variety of methods including the use of GPRS modems or connecting to a utility data management system. The data is stored and processed on a remote server. Alarms can be generated based on algorithms and data can be viewed using visualization tools.

If the leakage current characteristics of the insulators are known, alarms can be generated automatically based on pre-set leakage current alarm levels. Warnings or alarms can be raised to initiate insulator maintenance (e.g. washing) if certain pre-set leakage current thresholds are exceeded. Leakage current information can also be used select appropriate mitigation measures.

It should be noted that the sensor units 20 are connected between the insulator and the grounding system. With this configuration the insulator leakage current is directly shunted to ground and it will therefore not pass through the wood cross arm. The leakage currents measured can however be used to raise warnings that conditions and insulator contamination levels are sufficiently high to cause wood pole fires.

The sensor unit 20 described above has several advantages. The sensor units 20 are suitable for wide spread deployment which makes them practical for installations on overhead lines and substations. Some of the specific advantages of the sensor are low cost; absence of wiring to either power the sensor unit 20 or communicate with the sensor 20, leading to improved reliability compared to wired units; the ability to quickly deploy many sensor units 20; on-board processing of data, providing a user with processed information on which he can make a decision; and a combination of analog and digital electronics, ensuring that no current pulses are ever missed, as compared to previous technologies that used digital measurement only.

The foregoing has described a sensor apparatus for detecting and monitoring leakage current in suspension type insulators. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. A sensor apparatus for detecting leakage current in a suspension-type insulator of an electrical power system, the apparatus comprising:
   (a) a housing having a leakage current sensor contained therein, the leakage current sensor being adapted to detect a leakage current along the insulator;
   (b) a door pivotally connected to the housing and adapted to move between an open position where a grounded end fitting of the insulator is received by the sensor apparatus and a closed position where the grounded end fitting is positioned between the housing and the door; and
   (c) a clamping mechanism physically separate and independent from the door and connected to the housing, the clamping mechanism being adapted to clamp the sensor apparatus to the grounded end fitting of the insulator, wherein the clamping mechanism includes:
   (i) a first jaw supported by a first arm;
   (ii) a second jaw supported by a second arm; and
   (ii) wherein the first and second arms are pivotally connected to the housing to allow the jaws to move from an open position where the grounded end fitting is received between the jaws and a closed position where the jaws clamp around the grounded end fitting to secure the sensor apparatus to the insulator.

2. The sensor apparatus according to claim 1, wherein the leakage current sensor is formed of two halves such that a first one of the halves is secured to the housing and a second one of the halves is secured to the door to allow the grounded end fitting of the insulator to be received between the first and second halves.

3. The sensor apparatus according to claim 1, wherein the clamping apparatus further includes:
   (a) a first threaded collar connected to the first arm;
   (b) a second threaded collar connected to the second arm; and
   (c) a bolt mechanism in threaded engagement with the first and second arms, wherein when the bolt mechanism is turned, the first and second arms pivot between the open and closed positions.

4. The sensor apparatus according to claim 3, wherein the bolt mechanism includes first and second opposing bolts coupled together at their ends by a coupling to allow the first and second bolts to work in unison.

5. The sensor apparatus according to claim 1, wherein the first and second jaws include a plurality of apertures for receiving a fastener therethrough, the apertures being positioned to allow the first and second jaws to be adjusted with respect to the first and second arms to allow the clamping mechanism to receive different sized grounded end fittings.

6. The sensor apparatus according to claim 1, further including an electronics module adapted to receive a signal from the leakage current sensor and a communications system operable to wirelessly transmit the signal to an external receiver.

7. A sensor apparatus for detecting leakage current in a suspension-type insulator of an electrical power system, the apparatus comprising:
   (a) a housing having a first half of a leakage current sensor contained therein, the leakage current sensor being adapted to detect a leakage current along the insulator;
   (b) a door pivotally connected to the housing and having a second half of a leakage current sensor contained therein, the door being adapted to move between an open position where a grounded end fitting of the insulator is received by the housing and a closed position, wherein when the door is moved to the closed position, mating surfaces of the first and second halves of the leakage current sensor join together to create a closed perimeter around the grounded end fitting; and
   (c) a clamping mechanism physically separate and independent of the door and connected to the housing, the clamping mechanism being adapted to clamp the sensor apparatus to the grounded end fitting of the insulator, wherein the clamping mechanism includes:
   (i) a first jaw supported by a first arm;
   (ii) a second jaw supported by a second arm; and
   (iii) wherein the first and second arms are pivotally connected to the housing to allow the jaws to move from an open position where the grounded end fitting is received between the jaws and a closed position where the jaws clamp around the grounded end fitting to secure the sensor apparatus to the insulator.

8. The sensor apparatus according to claim 7, wherein the clamping apparatus further includes:
   (a) a first threaded collar connected to the first arm;
   (b) a second threaded collar connected to the second arm; and
   (c) a bolt mechanism in threaded engagement with the first and second arms, wherein when the bolt mechanism is turned, the first and second arms pivot between the open and closed positions.

9. The sensor apparatus according to claim 7, wherein the clamping mechanism includes:
   (a) first and second jaws adapted to clamp the sensor apparatus to the grounded end fitting of the insulator; and
   (b) a bolt mechanism adapted to move the first and second jaws between an open position for receiving the grounded end fitting and an closed position for clamping onto the grounded end fitting.

10. The sensor apparatus according to claim 7, further including a hot stick adapter to allow a user to use a hot stick to place the sensor apparatus onto the insulator under live conditions.

11. The sensor apparatus according to claim 7, further including a fastener for securing the door in a closed position.

12. The sensor apparatus according to claim 7, wherein the leakage current sensor generates an analog signal proportional to a received leakage current.

13. The sensor apparatus according to claim 12, further including:
   (a) an electronics module operably connected to the leakage current sensor to covert the analog signal to a digital value; and
   (b) a communications system operable to wirelessly transmit the digital value to an external receiver.

14. The sensor apparatus according to claim 7, wherein the leakage current sensor includes:
   (a) a current transformer having:
      (i) a ferrite core having windings wrapped therearound;
   (b) a metal housing around the ferrite core and windings to shield the current transformer from magnetic fields, wherein the metal housing includes a slot extending along an inner surface of the metal housing to allow the core to couple with a magnetic field from current flowing in the grounded end fitting.

15. A method of detecting leakage current in a suspension-type insulator of an electrical power system, the method comprising:
   (a) providing a sensor apparatus having:
      (i) a door pivotally connected to a housing, wherein the door and the housing each carry a half of a leakage current sensor; and
      (ii) a clamping mechanism connected to the housing and physically separate and independent of the door;
   (b) installing the sensor apparatus onto a grounded end fitting of the insulator by:
      (i) moving the door to an open position;
      (ii) moving jaws of the clamping mechanism to an open position;
      (iii) receiving the grounded end fitting between the jaws and moving the jaws to a closed position, wherein the jaws clamp onto the grounded end fitting and secure the sensor apparatus to the insulator; and
      (iv) moving the door to a closed position and securing the door in the closed position to the housing, such that mating surfaces of the halves of the sensor join together to create a closed perimeter around the grounded end fitting;
   (c) conducting a leakage current from the grounded end fitting of the insulator through a current transformer of the leakage current sensor;
   (d) generating an analog signal proportional to the leakage current flowing through the current transformer;
   (e) converting the analog signal to a digital value; and
   (f) transmitting the digital value to an external receiver.

16. The method according to claim 15, further including the step of using the electronics module to assign the digital value to one of a plurality of bins based on a magnitude of the digital value, wherein each of the plurality of bins represents a predetermined range of magnitudes of leakage current.

17. The method according to claim 16, further including the step of incrementing the assigned bin each time a digital value is assigned to the bin.

18. The method according to claim 15, further including the step of using the electronics module to detect a peak value of the analog signal at a first interval.

19. The method according to claim 18, further including the step of using the electronics module to convert the peak value to the digital value.

20. The method according to claim 15, further including an electronics module configured to receive the analog signal and convert the analog signal to the digital value.

21. The method according to claim 15, further including a communications system configured to wirelessly transmit the digital value to the external receiver.

* * * * *